United States Patent [19]

Komaki

[11] 3,973,148
[45] Aug. 3, 1976

[54] QUARTZ CRYSTAL VIBRATOR UNIT
[75] Inventor: Shojiro Komaki, Mitaka, Japan
[73] Assignee: Kabushiki Kaisha Daini Seikosha, Japan
[22] Filed: Aug. 30, 1974
[21] Appl. No.: 502,186

[30] Foreign Application Priority Data
  Aug. 31, 1973  Japan.................. 48-102221[U]

[52] U.S. Cl................ 310/8.9; 310/8.1; 310/8.2; 310/9.1
[51] Int. Cl.²................................. H01L 41/04
[58] Field of Search............... 310/8.1, 8.2, 9.1, 8.9; 58/23 TF, 23 AC; 331/157, 158, 176, 116, 155

[56]  References Cited
  UNITED STATES PATENTS
  3,404,298  10/1968  Roberts.................. 310/8.9
  3,568,093  3/1971   Ishida.................... 331/116
  3,791,133  2/1974   Hashimura et al....... 310/8.9 X
  3,803,828  4/1974   Keeler et al............ 58/23 AC
  3,842,585  10/1974  Lupoli................... 58/23 AC Primary Examiner—Mark O. Budd
Attorney, Agent, or Firm—Robert E. Burns; Emmanuel J. Lobato; Bruce L. Adams

[57] ABSTRACT

A quartz crystal vibrator unit having a passive electronic element such as a condenser is disclosed. The passive electronic element having the value to compensate the deviation of oscillating frequency from the predetermined center frequency is selected and fixed on the case of quartz crystal vibrator. Since frequency adjustment at assembling process is eliminated, work efficiency is remarkably increased.

4 Claims, 8 Drawing Figures

QUARTZ CRYSTAL VIBRATOR UNIT

BACKGROUND OF THE INVENTION

This invention relates to quartz crystal vibrator units composed of a passive electronic element, such as a condenser or a resistor, connected to a quartz crystal vibrator element.

The various electronic parts which make up an oscillating circuit are not necessarily incorporated into a single unit in such conventional devices using a quartz crystal vibrator, as, for example, a wrist watch, a clock and etc. Then it is not convenient to assemble such devices or service them because of the many terminals which need to be connected and disconnected.

Generally speaking, the center frequency of mass-produced quartz crystal vibrators are normally distributed around predetermined resonant frequency, $f_0$. Then the oscillating frequency of each vibrator is adjusted to a predetermined oscillating frequency by incorporating therewith a passive element, for example, a variable capacitor.

A conventional oscillating circuit is shown in FIG. 1. In this figure, a quartz crystal vibrator 1 is connected in parallel with an inverter circuit 2. $C_G$ denotes a variable capacitor and $C_D$ denotes a condenser.

Deviation of the oscillating frequency of each oscillator around a predetermined center frequency is caused mainly by deviation of the natural frequency of each individual quartz crystal vibrator and partly by deviation of the value of the other associated electronic parts. Deviation of the former is far larger than that of the latter, however, the frequency adjustment of a vibrator itself is so difficult to make that the frequency adjustment of the oscillating circuit is carried out mainly by selecting appropriate condensers $C_G$ and/or $C_D$ having suitable capacitance values to achieve the frequency adjustment.

FIG. 2 shows the frequency shift of the oscillating circuit shown in FIG. 1 when either the capacitance value of condensers $C_G$ or $C_D$ is changed.

When the capacitance of condenser $C_G$ is changed, but the capacitance of condenser $C_D$ is not changed, the value of resonant frequency of the circuit is shifted along the line $\overline{PQ}$. Likewise, if the capacitance of the condenser $C_D$ is changed and the capacitance of the condenser $C_G$ is not changed, the same effect appears. As mentioned above, the natural frequencies of mass-produced quartz crystal vibrators are normally distributed around a predetermined resonant frequency $f_0$. This distribution is shown on the line $\overline{PQ}$.

In order to adjust the resonant frequency of these distributed frequencies to the center frequency $f_0$, the capacitance of both condensers $C_D$ and $C_G$, or the value of one of them, have to be chosen. Therefore in order to precisely adjust these distributed resonant frequencies to the center frequency $f_0$, many condensers having different capacitance values, have to be prepared. In case the natural frequencies of the mass-produced quartz crystal vibrators distribute more widely than herein described, then more condensers have to be prepared.

When a quartz crystal vibrator having a natural frequency within the range of $\pm 20$ p.p.m is incorporated into the oscillating circuit, and in order to adjust its oscillating frequency within $\pm 2$ p.p.m., the capacitance value of the condenser $C_G$ should be in the range of 10 – 70 pf. This has been ascertained experimentally.

When oscillating circuits are assembled, it is preferable to prepare a variable capacitor, such as a trimmer condenser, instead of preparing many fixed condensers having different capacitance values. However, it is impossible to get a small variable condenser whose variable range is from 10 pf to 70 pf. Hence the quartz crystal vibrators which are presently incorporate into watches are selected from those having only a narrow range of natural frequencies. This is the reason why the cost of an oscillator for a timepiece is expensive since its natural frequency must be extremely close to the center frequency $f_0$ and this drawback is effectively eliminated.

SUMMARY OF THE INVENTION

An object of the invention is to provide an inexpensive and compact oscillator unit.

Another object of the invention is to provide oscillator units whose oscillating frequencies are adjusted to predetermined center frequency by selecting a condenser having a suitable value of capacitance.

According to this invention, the oscillating frequencies of a vibrator may be adjusted to predetermined center or reference frequency by selecting a suitable condenser, even if the individual oscillating frequencies vary to a large extent. Since the quartz crystal vibrator and the passive electronic element which compensates for the oscillating frequency of the vibrator are joined into one unit, the efficiency of assembly is remarkably increased by reason of the fact that there is no need to adjust the oscillating frequency itself, and moreover the whole unit may be readily removed and replaced in case of maintenance and repair at service shops.

The nature, principle, and details of the invention along with other objects and advantages thereof will be best understood by reference to the following description, taken in conjunction with the accompanying drawings.

DETAILED DESCRIPTION OF THE INVENTION

Now will be explained the various embodiments of this invention. For purposes of explanation suppose that there is a quartz crystal vibrator whose natural frequency deviates an amount $\Delta f$ (for example + 20 p.p.m.) from a predetermined center or reference frequency. This deviation of the oscillating frequency from the center frequency may easily be compensated by joining a suitable condenser with the quartz crystal vibrator.

Figure 1:
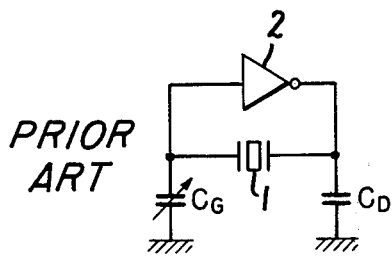
FIG. 1 shows a prior art type of oscillating circuit.
Figure 2:
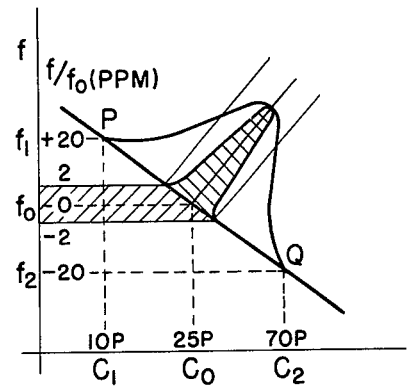
FIG. 2 shows the frequency shift of the oscillating circuit shown in FIG. 1.
Figure 3:
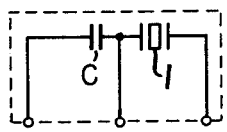
FIG. 3 to FIG. 6 show circuit constructions of vibrator units according to the invention.
Figure 4:
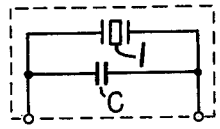

As is understood from FIG. 2, an oscillating frequency ($f_1$) which deviates + 20 p.p.m. from a predetermined center frequency can be adjusted to center frequency ($f_0$) by adopting the condenser $C_2$ having a value of 70 pf.

According to this invention, after measuring the natural frequency of a quartz crystal vibrator, a suitable condenser having a capacitance value chosen to compensate for the deviation of the vibrator oscillating frequency from a predetermined center of reference frequency is selected. After selection of the condenser, the quartz crystal vibrator and the condenser are joined into one unit. Then a fixed condenser is available for a condenser $C_G$, even if it is replaced by a variable condenser, the variable range may be extremely narrow.

This enables to incorporate a variable condenser into a watch of which space is limited.

Other passive electronic elements such as a resistor or an inductor may be used instead of a condenser, and a vibrator unit may be made in a same way incorporating with such an element.

Figure 5:
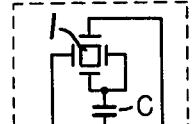
Figure 6:
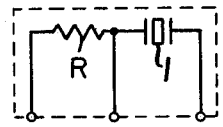

FIG. 3 to FIG. 6 show various circuit constructions of vibrator units according to the invention in which a quartz crystal vibrator 1 and other passive electronic parts are joined into one unit as represented by dashed lines surrounding the parts. The quartz crystal vibrator 1 and the condenser C are connected in series in FIG. 3, and are connected in parallel in FIG. 4. In FIG. 5, a quartz crystal vibrator 1 of the type having four terminals is disclosed and two of the terminals are interconnected to a junction point of the condenser so that there are only three external terminals. In the variant of FIG. 6, the condenser C is replaced by a resistor R.

Figure 7A:
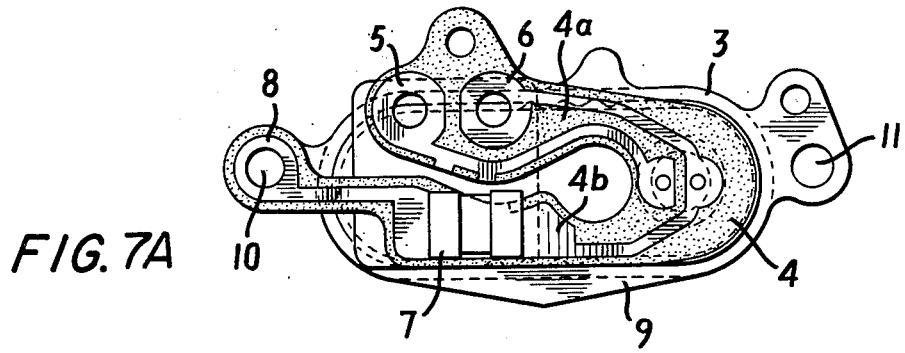
FIG. 7 shows the vibrator unit according to this invention with FIG. 7A being a top view of the vibrator unit and FIG. 7B being a side view of the unit.
Figure 7B:
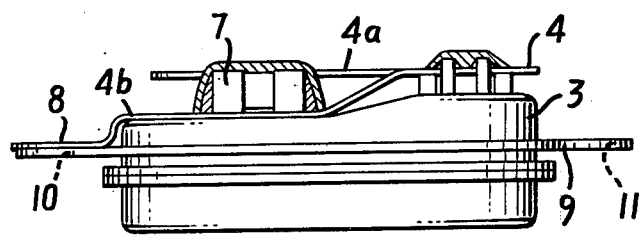

FIG. 7 shows the assembled vibrator unit according to this invention, FIG. 7A being a top view of the unit and FIG. 7B being a side view thereof. As shown in these figures, a case 3 has sealed therein a quartz crystal vibrator (not shown). A printed circuit board 4 having forks 4a and 4b is fixed on the top of the case 3.

The fork 4a has at one end terminals 5 and 6 which are connected through the printed circuit board to terminals of the quartz crystal vibrator sealed within the case 3. The fork 4b has a bent portion, as seen in FIG. 7B, and has at one end a terminal 8, and mounted on the fork 4b is a condenser 7. The capacitance of this condenser is selected to compensate for deviation of the actual oscillating frequency of the vibrator from a predetermined center frequency. A supporting member or board 9 mounts the vibrator unit, and is provided with holes 10 and 11 for enabling connection of the vibrator unit to other structure.

While a preferred embodiment of the invention has been shown and described, it will be understood that many modifications and changes thereto can be made within the true spirit and scope of the invention and the invention is intended to cover all such obvious modifications and changes falling within the appended claims.

I claim:

1. A quartz crystal vibrator unit for use in a timepiece and the like comprising: a case; a quartz crystal vibrator sealed in said case and having a given resonant frequency; a printed circuit board mounted on said case and containing electric circuitry which terminates in no more than three terminals to enable connection to other circuitry, said printed circuit board having a generally forked shape with two forks, one fork extending along in contact with a surface portion of said case and containing one of said three terminals, and the other fork extending in spaced relationship from said case in the same general direction as said one fork and containing the remaining two of said three terminals; a condenser mounted on said one fork of said printed circuit board and having a capacitance value chosen to compensate for deviation of the quartz crystal vibrator resonant frequency from a predetermined reference frequency; and means electrically connecting said quartz crystal vibrator and said condenser to said electric circuitry of said printed circuit board to thereby define a compact quartz crystal vibrator unit having a resonant frequency compensated to said predetermined reference frequency.

2. A quartz crystal vibrator unit according to claim 1; wherein said means electrically connecting said quartz crystal vibrator and said condenser includes electric circuitry on said printed circuit board connecting them in series circuit relationship.

3. A quartz crystal vibrator unit according to claim 1; wherein said means electrically connecting said quartz crystal vibrator and said condenser includes electric circuitry on said printed circuit board connecting them in parallel circuit relationship.

4. A quartz crystal vibrator unit according to claim 2; including a supporting board having said case supported thereon.

* * * * *